(12) United States Patent
Deane (10) Patent No.: US 7,684,663 B2
(45) Date of Patent: Mar. 23, 2010

(54) COUPLING OF OPTICAL INTERCONNECT WITH ELECTRICAL DEVICE

(75) Inventor: Peter Deane, Moss Beach, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 12/345,487

(22) Filed: Dec. 29, 2008

(65) Prior Publication Data

US 2009/0129786 A1        May 21, 2009

Related U.S. Application Data

(63) Continuation-in-part of application No. 11/934,585, filed on Nov. 2, 2007, now Pat. No. 7,627,204.

(51) Int. Cl.
   *G02B 6/12*       (2006.01)
   *G02B 6/10*       (2006.01)

(52) U.S. Cl. ................... 385/14; 385/129; 385/130

(58) Field of Classification Search ................... None
   See application file for complete search history.

(56) References Cited

U.S. PATENT DOCUMENTS

| | | | |
|---|---|---|---|
| 5,375,184 A | 12/1994 | Sullivan | |
| 6,539,157 B2 | 3/2003 | Doi | |
| 6,865,307 B1 | 3/2005 | Ma et al. | |
| 7,197,221 B2* | 3/2007 | Ohtsu et al. | 385/130 |
| 7,267,930 B2 | 9/2007 | Payne | |
| 7,333,682 B2 | 2/2008 | Kobayashi et al. | |
| 2002/0181882 A1 | 12/2002 | Hibbs-Brenner et al. | |
| 2004/0218848 A1 | 11/2004 | Shen et al. | |
| 2005/0201681 A1 | 9/2005 | Payne | |
| 2005/0201693 A1* | 9/2005 | Korenaga et al. | 385/89 |
| 2005/0220393 A1 | 10/2005 | Riester et al. | |
| 2005/0271319 A1 | 12/2005 | Graham | |
| 2005/0271326 A1 | 12/2005 | Luo | |
| 2006/0001653 A1 | 1/2006 | Smits | |
| 2006/0002655 A1 | 1/2006 | Smits | |
| 2007/0032275 A1 | 2/2007 | Suzuki et al. | |
| 2008/0031579 A1 | 2/2008 | Enami et al. | |

(Continued)

OTHER PUBLICATIONS

Office Action dated Aug. 19, 2008 in U.S. Appl. No. 11/934,585.

(Continued)

*Primary Examiner*—Uyen-Chau N Le
*Assistant Examiner*—Chris H Chu
(74) *Attorney, Agent, or Firm*—Beyer Law Group LLP (57) ABSTRACT

One embodiment of the present invention includes a flexible interconnect assembly that can convert between optical and electrical signals and that is configured to be easily secured to an electrical device, such as a printed circuit board or integrated circuit chip. The flexible interconnect assembly includes a flexible substrate and one or more optical waveguides that are mounted on the flexible interconnect and suitable for transmitting optical signals. One or more conversion devices for converting between electrical and optical signals are arranged on the flexible substrate. The flexible interconnect assembly optionally includes an attachment fixture that enables the flexible substrate to be reversibly coupled to an attachment apparatus. Particular embodiments of the present invention involve methods, devices and systems for using a flexible interconnect assembly with one or more electronic substrates configured with an attachment apparatus.

25 Claims, 9 Drawing Sheets

U.S. PATENT DOCUMENTS

2008/0031584 A1    2/2008   Payne
2008/0118200 A1*   5/2008   Kim et al. ..................... 385/14
2008/0226222 A1*   9/2008   Kim et al. ..................... 385/14
2008/0285910 A1*  11/2008   Yamada et al. ................ 385/14
2009/0041408 A1*   2/2009   Kondo et al. .................. 385/14

OTHER PUBLICATIONS

U.S. Appl. No. 11/498,356, filed Aug. 2, 2006.

* cited by examiner

COUPLING OF OPTICAL INTERCONNECT WITH ELECTRICAL DEVICE

CROSS-REFERENCE TO RELATED APPLICATION

This application is a continuation-in-part application claiming priority to U.S. patent application Ser. No. 11/934,585, entitled "Optical-Electrical Flex Interconnect Using a Flexible Waveguide and Flexible Printed Circuit Board Substrate," which is incorporated herein in its entirety.

FIELD OF THE INVENTION

The present invention relates generally to flex interconnects, and more particularly, to a flex interconnect including an optical waveguide formed on a flexible substrate for transmitting and receiving both optical and electrical signals.

DESCRIPTION OF THE RELATED ART

The functionality provided on portable devices, such as laptop computers, cell phones, personal-digital assistants (PDAs), cameras, and MP3 players, is both converging and continually increasing. For example, not that long ago, a person typically had a separate laptop computer for performing data processing, sending emails and text messaging, a cell phone for making wireless phone calls, a camera for taking pictures, and an MP3 player for listening to music and other audio content. More recently, however, the functionality provided by one or more of these separate devices has been implemented all on one device. For example, cell phones now commonly have cameras, allow users to receive and transmit still video images, have emails and text message capabilities, include embedded MP3 players, and as well perform standard cell phone functionality. In addition, as bandwidth increases and wireless broadband services proliferate, the ability for these portable devices to both generate and receive streaming video will also become commonplace.

High data rate transmissions, such as that used during the transfer of streaming video, typically is performed using low amplitude electrical signals over wires. Low amplitude differential signals, however, are susceptible to data corruption when exposed to RF noise. This is particularly troublesome in wireless portable devices. If the portable device is streaming video while transmitting or receiving radio signals, the RF noise may corrupt the low amplitude signals, resulting in video errors.

The use of an optical link in a portable device for high band width applications, such as streaming video, is advantageous for several reasons. Optical signals are largely immune from RF noise. The data transfer rate is also typically greater using an optical link as compared to electrical wires.

Power and control signals, which are typically of high amplitude and low frequency, are not as susceptible to RF noise. The use of electrical wires for the transmission of these types of signals in a portable device is usually adequate.

Accordingly, an opto-electric flex interconnect with an integrated electrical-to-optical and optical-to-electrical interface, which enables the optical transport of critical high speed data without the need of expensive and bulky optical connectors, and electric traces for power and control signals, is therefore needed.

SUMMARY OF THE INVENTION

One embodiment of the present invention includes a flexible interconnect assembly that can convert between optical and electrical signals and that can be easily secured to an electrical device, such as a printed circuit board or integrated circuit chip. The flexible interconnect assembly includes one or more waveguides mounted on a flexible substrate. The one or more waveguides are configured to transmit optical signals. One or more conversion devices for converting between electrical and optical signals are arranged on the flexible interconnect assembly. The flexible interconnect assembly also includes an attachment fixture that enables the flexible substrate to be reversibly coupled to an attachment apparatus.

In an alternative embodiment, a system for transmitting data to a device is disclosed. The system includes an electrical device and a flexible interconnect assembly. The electrical device is electrically connected with an attachment apparatus suitable for reversibly securing a flexible interconnect assembly. The flexible interconnect assembly includes one or more waveguides and a conversion device for converting between electrical and optical signals. The attachment apparatus on the electrical device is reversibly coupled with the flexible interconnect assembly and enables the receiving of electrical signals from the conversion device, the transmitting of electrical signals to the conversion device, or both.

In another embodiment, a method for transmitting data to an electrical device is disclosed. In this method, a flexible interconnect assembly with an optical waveguide and one or more electro-optic transceivers is provided. Afterward, a first set of electrical signals is transmitted from a first electrical device to the flexible interconnect assembly. The first set of electrical signals is received at one or more electro-optic transceivers of the flexible interconnect assembly, where it is converted into a set of optical signals. Some embodiments feature different numbers and types of converters, transceivers, and electrical devices.

In another embodiment, a system for communicating signals between multiple electrical components is disclosed. The system includes multiple electrical components coupled with one another via multiple flexible interconnect assemblies. Each of the flexible interconnect assemblies is configured to convert between electrical signals and another type of signal. While such signals are being transmitted through the flexible interconnect assemblies, no crosstalk is produced. In particular embodiments, the transmitted signals are clock signals and/or time synchronization data.

In another embodiment, an electrical device for receiving electrical signals from a flexible interconnect assembly is provided. The electrical device includes an electronic substrate, such as a printed circuit board, processor or integrated circuit chip. The electronic substrate has a set of electrical contacts. An attachment apparatus is mounted onto the electronic substrate and is configured to be reversibly secured to a flexible interconnect assembly. This establishes an electrical connection between the flexible interconnect assembly and the set of electrical contacts of the electronic substrate.

BRIEF DESCRIPTION OF THE DRAWINGS

The invention, together with further advantages thereof, may best be understood by reference to the following description taken in conjunction with the accompanying drawings in which.

In the figures, like reference numbers refer to like components and elements.

DETAILED DESCRIPTION OF THE INVENTION

Figure 1:
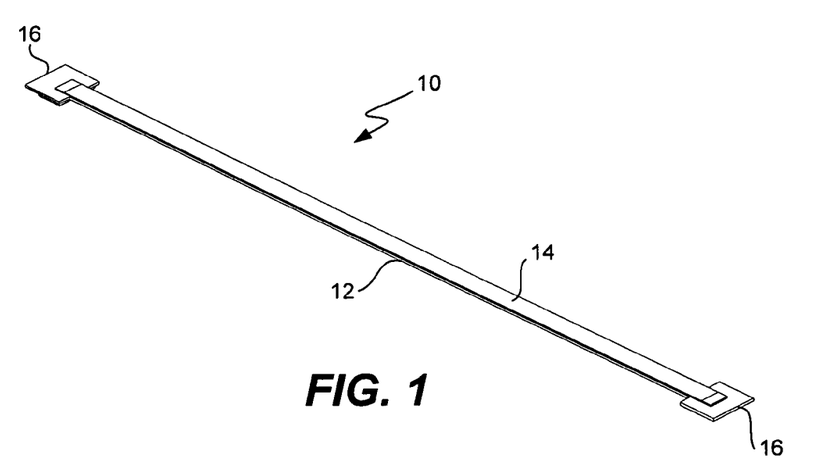
FIG. 1 is a perspective view of a flex interconnect assembly according to one embodiment of the present invention.

Referring to FIG. 1, a perspective view of an opto-electric flex interconnect assembly according to one embodiment of the present invention is shown. The opto-electric flex interconnect assembly 10 includes a flexible printed circuit substrate 12 with one or more electrical interconnects 13 (not visible) for transmitting electrical signals and a flexible optical waveguide 14 mounted onto the substrate 12. The optical waveguide 14 includes one or more cores 15 (also not visible) for transmitting optical signals. In one embodiment, the electrical interconnects are used for transmitting power and control signals, whereas the optical cores are used for transmitting data signals.

The assembly 10 further includes electrical-to-optical and optical-to-electrical interfaces 16 located at either end of the assembly 10. As described in more detail below, the waveguide 14 and interfaces 16 provide an optical transport layer integrated within the assembly 10. With interfaces 16, expensive and bulky optical connectors are not needed. The interfaces 16 allow the assembly 10 to be directly connected to other electrical components (not illustrated), such as printed circuit boards, using inexpensive off the shelf electrical connectors.

Figure 2:
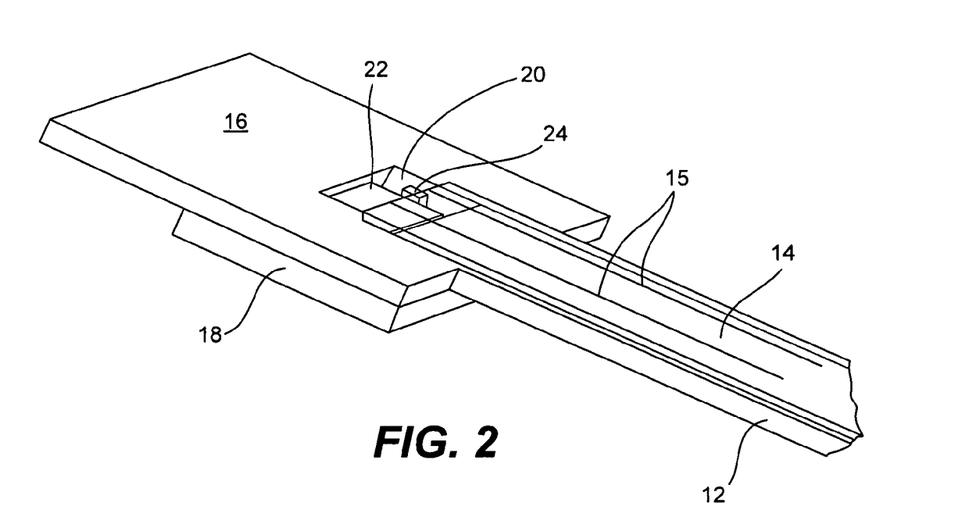
FIG. 2 is an enlarged view of an interconnect module including an integrated transport layer of the flex assembly according to one embodiment of the present invention.

FIG. 2 is an enlarged perspective view of one of the interfaces 16 mounted onto a header substrate 18. As illustrated in the figure, the interface 16, in the embodiment shown, includes a rectangular shaped extension of the substrate 12. A recess or window 20 is formed in the extension to accommodate one or more opto-electrical components 22 and 24, which are mounted onto the header substrate 18. With this arrangement, the opto-electrical components 22 and 24 are accessible through the recess 20. The cores 15 of the optical waveguide 14 terminate at the vicinity of the opto-electrical components 22, 24. In this manner, the cores 15 are in optical communication with the components 22, 24, as described in more detail below.

Figure 3A:
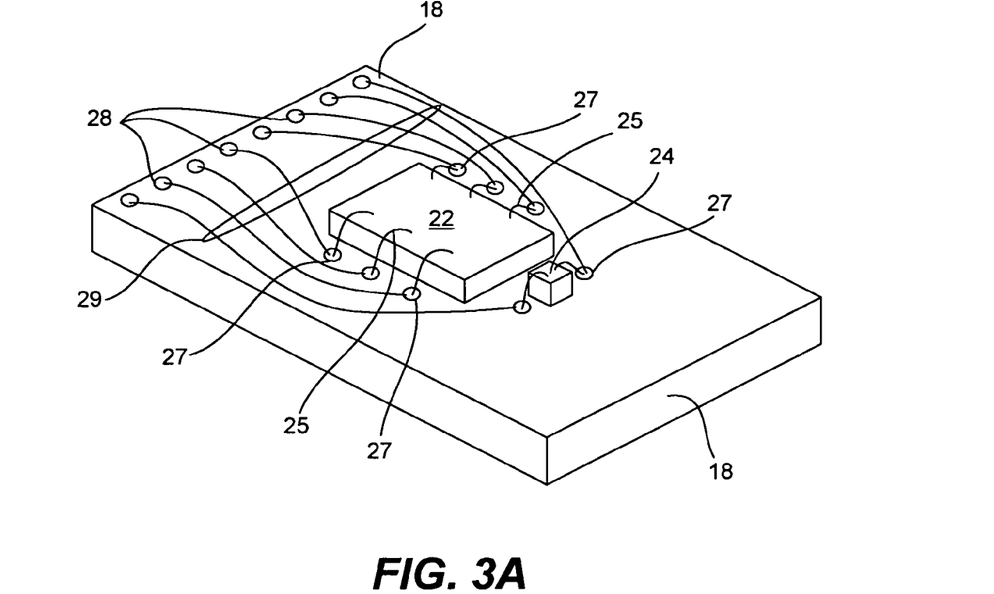
FIG. 3A is a perspective view of a header substrate which mates with an interconnect module according to one embodiment of the present invention.

FIG. 3A is a perspective view of the header substrate 18, which is in one embodiment, a printed circuit board. Opto-electric components 22 and 24 are mounted onto the substrate 18. In various embodiments, the components 22 and 24 are semiconductor optical detectors, optical transmitters, or a combination of thereof. For example, the components 22, 24 may be either electrical-to-optical conversion devices such as a laser, LED, or VCSEL. Alternatively, the components 22, 24 may be optical-to-electrical conversion devices, such as a semiconductor photo-detector. In yet another embodiment, one or more of each type of component may be mounted onto the substrate 18. Electrical connections 25, such as wire bonds, are formed between the components 22 and 24 and contacts 27 formed on the substrate 18. Input/output contacts 28 are in electrical connection with the contacts 27 via traces 29 formed on the substrate 18. It should be noted that although the electrical connections are illustrated as wire bonds, this in no way should be construed as limiting the present invention. It is contemplated that other electrical connection types may be used, such as surface mount devices, ball grid array type packages, etc.

Figure 3B:
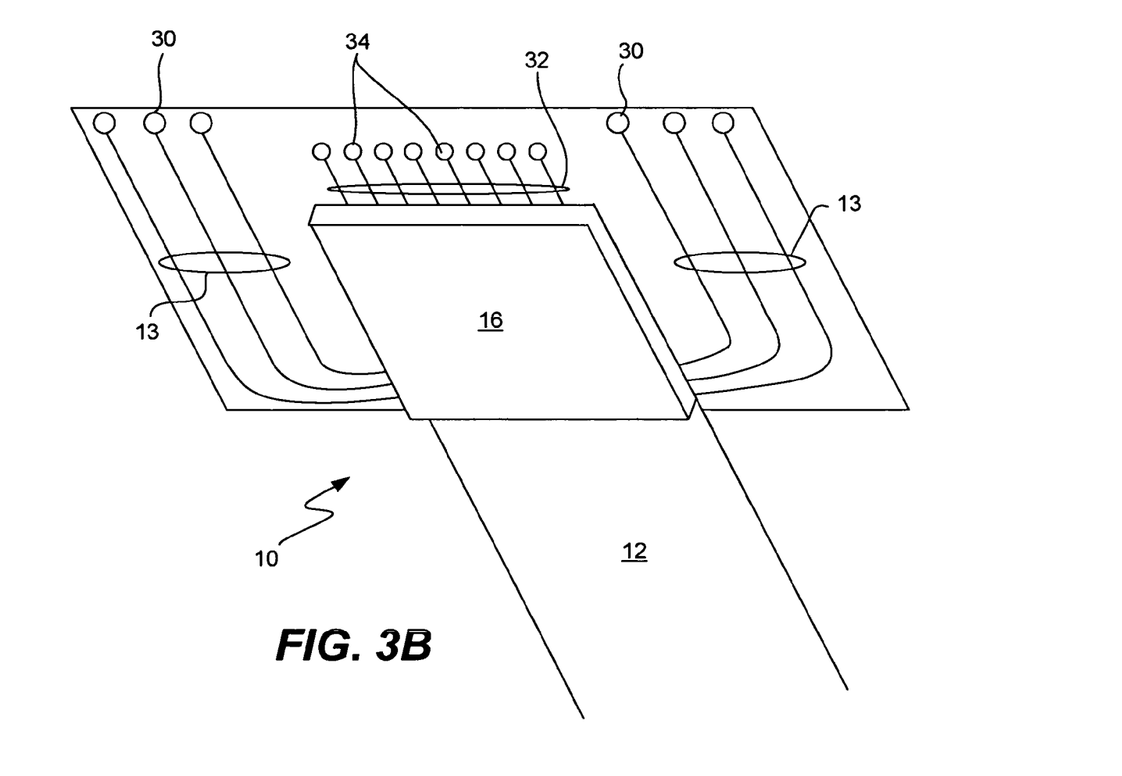
FIG. 3B is a bottom-up view of the header substrate and the interconnect module according to one embodiment of the present invention.

Referring to FIG. 3B, a bottom-up perspective view of the module 16 is shown. As illustrated, the header substrate 18 is mounted onto the undersurface of the module 16. As illustrated, the bottom of the module 16 includes the electrical traces 13 of the flexible printed circuit substrate 12, which terminate at contacts 30. Also visible on the undersurface of the module 16 are a second set of traces 32 and contacts 34. These traces 32 are aligned and in electrical contact with the input/output contacts 28 provided on the top surface of substrate 18, as best illustrated in FIG. 3A. With this arrangement, the transport layer is integrated within the assembly 10, without the need for expensive and bulky optical connectors.

Figure 3C:
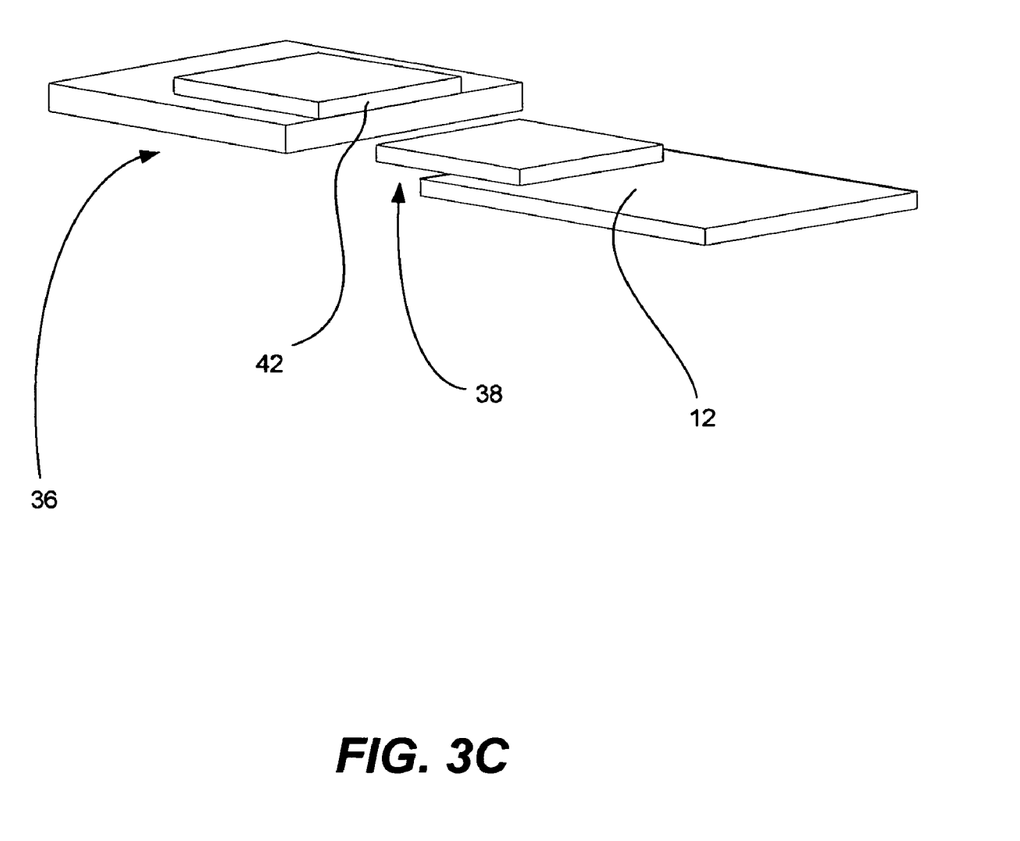
FIG. 3C is a perspective view of an attachment apparatus and an interconnect assembly with an attachment fixture according to one embodiment of the present invention.

FIG. 3C represents an alternative embodiment of assembly 10 with attachment fixture 38. In the illustrated embodiment, attachment fixture 38 is configured to couple with attachment apparatus 36, which is mounted on an electrical device (not shown), such as a printed circuit board, device package or integrated circuit chip. In general, assembly 10 and attachment apparatus 36 characterize a specific embodiment of a broader family of interconnect features that enable the opto-electric flex interconnect assembly 10 to be releasably attached with an electrical device. This is typically accomplished by electrically connecting the flex assembly to a selected electrical device by using a releasable locking feature that hold the components in place and in electrical contact until released. In the illustrated embodiment of FIG. 3C, fixture 38 is inserted into opening 42. Fasteners inside opening 42 help secure a physical and electrical connection between attachment apparatus 36 and attachment fixture 38. In various embodiments, different mechanisms are used to secure attachment apparatus 36 and attachment fixture 38. Examples of such mechanisms include slots, clamps, fasteners and/or latches. Electrical contacts on attachment apparatus 36 and attachment fixture 38 enable data flow between the electrical device and the flexible interconnect assembly 10.

The configuration and positioning of an attachment fixture may vary, depending on the needs of a particular application. In some embodiments, the attachment fixture enables coupling to or decoupling from the electrical device without the need for soldering or other high temperature processes. Small amounts of pressure, pulling and/or pushing may be the only actions required to secure or dislodge the attachment fixture. Particular embodiments of the attachment fixture include ridges, latches, protrusions, levers, hooks, locks, rings, depressions, clamps, slots and/or other features that help support the connection. An attachment fixture may also include one or more electrical contacts to facilitate the exchange of electrical signals with an external source. Generally, the attachment fixture helps to simplify and standardize the formation, removal and repair of a connection between assembly 10 and an electrical device such as an integrated circuit chip or printed circuit board.

Figure 4:
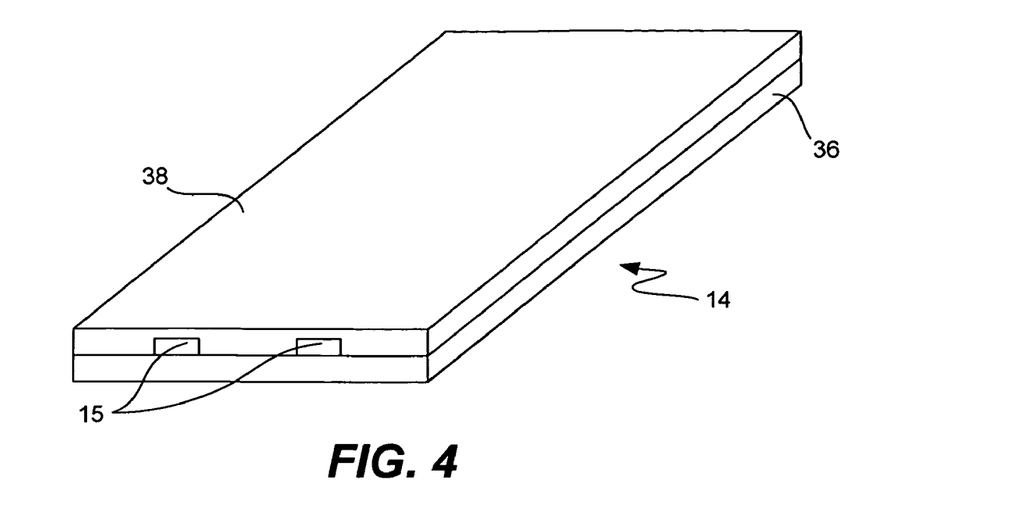
FIG. 4 is a perspective view of an optical waveguide used to make the flex interconnect.
Figure 5:
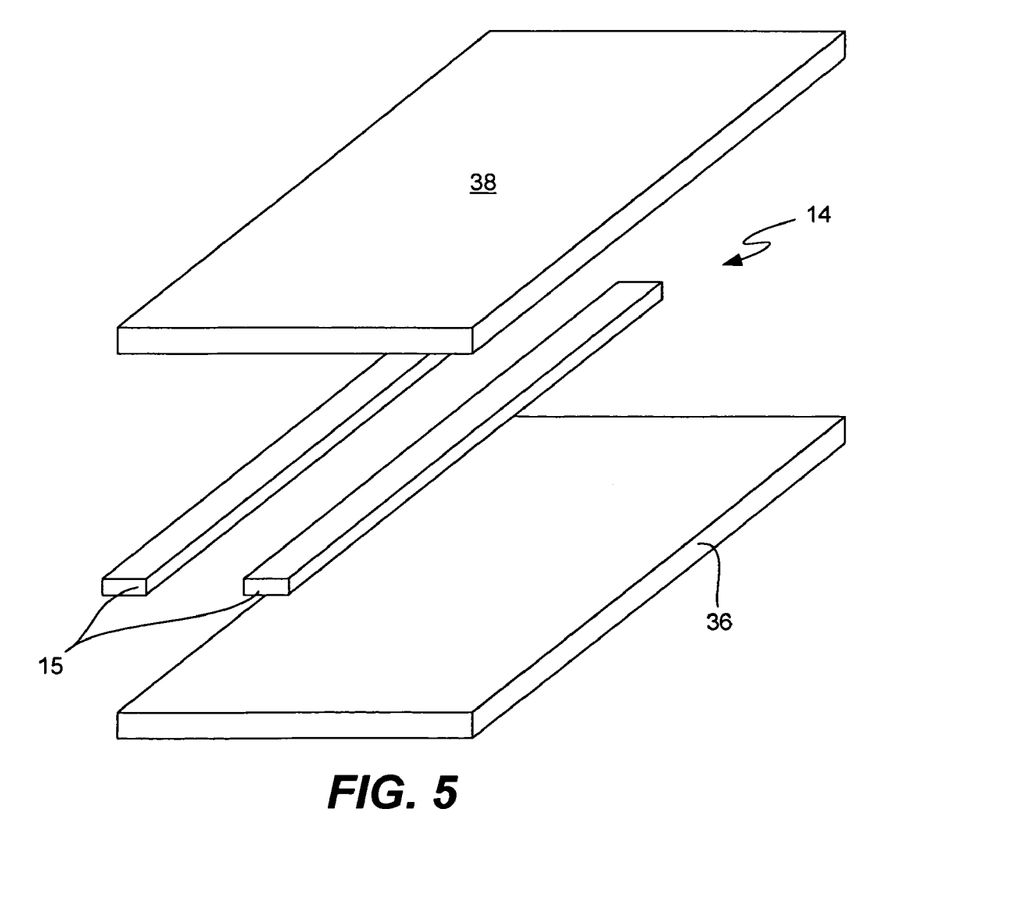
FIG. 5 is an exploded view of the optical waveguide of the flex interconnect.

FIGS. 4-5 illustrate features of optical waveguide 14 of FIGS. 1 and 2. In the illustrated embodiment, the optical waveguide 14 is a polymer waveguide. FIG. 4 is a perspective cross section view of the optical waveguide 14. The optical waveguide 14 includes a first or bottom polymer layer 36, one or more core polymer layers 15 formed on the first polymer layer 36, and a second or top polymer cladding layer 38 formed over the core layers 32. The cores 15 have an index of refraction that is larger than that of both the layers 36 and 38. FIG. 5 shows an exploded view of the bottom layer 36, the two cores 15 and the top cladding layer 38. For the sake of simplicity, only two cores 15 are illustrated. It should be noted that either more or fewer cores may be used in accordance with the present invention. In yet another embodiment, a polymer waveguide need not be used. A waveguide 14 including flexible glass or other optically transparent materials may be used. In some embodiments, optical waveguide 14 is configured for single-mode operation, which can help improve signal fidelity. Particular embodiments involve an optical waveguide 14 with cores 15 that each have a diameter ranging from 8 to 10 microns.

In various embodiments, the polymer cores and layers are made from Optically Clear Photopolymers, including, but not limited to Polysiloxanes, Polymethylmethacylates, epoxies, and other materials or a combination thereof. For more details on polymer waveguides, see US Patent Publication No. 2005/0201681 entitled "HYBRID WAVEGUIDE," U.S. Pat. No. 7,267,930 entitled "TECHNIQUES FOR MANUFACTURING A WAVEGUIDE WITH A THREE-DIMENSIONAL LENS," US Patent Publication No. 2005/0271326 entitled "WAVEGUIDE WITH A THREE-DIMENSIONAL LENS," US Patent Publication No. 2006/0002655 entitled "APPARATUS AND METHOD FOR MAKING FLEXIBLE WAVEGUIDE SUBSTRATES FOR USE WITH LIGHT BASED TOUCH SCREENS," US Patent Publication No. 2006/0001653 entitled "APPARATUS AND METHOD FOR A FOLDED OPTICAL ELEMENT WAVEGUIDE FOR USE WITH LIGHT BASED TOUCH SCREENS," US Patent Publication No. 2005/0271319 entitled "APPARATUS AND METHOD FOR A MOLDED WAVEGUIDE FOR USE WITH TOUCH SCREEN DISPLAYS, and US Patent Publication No. 2008/0031584, entitled "APPARATUS AND METHOD FOR A SINGULATION OF POLYMER WAVEGUIDES USING PHOTOLITHOGRAPHY," all assigned to the assignee of the present invention, and incorporated by reference herein for all purposes.

Figure 6:
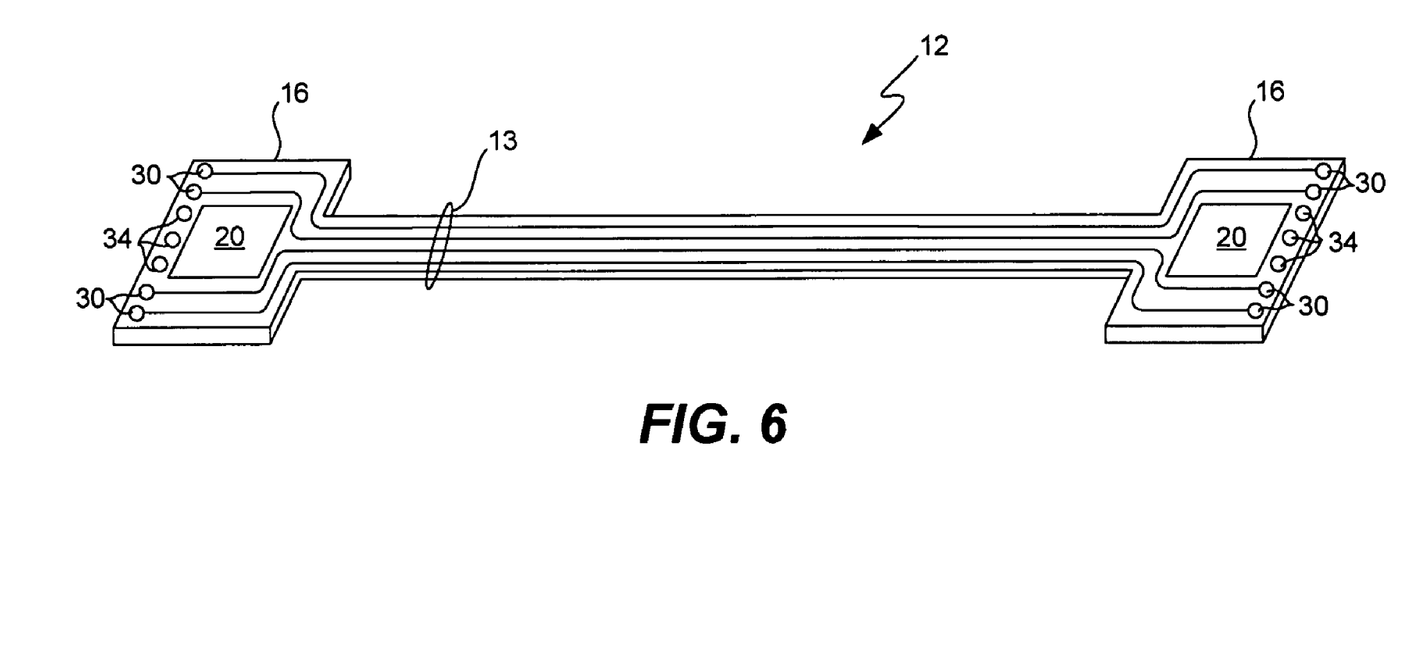
FIG. 6 is a perspective view of a flex printed circuit substrate of the flex assembly according to one embodiment of the present invention.

FIG. 6 is a perspective view of a flex printed circuit substrate 12. The substrate 12 includes, as noted above, the interfaces 16 located at each end of the substrate 12. The recess regions 20 are formed in the interface 16 to accommodate the components 22, 24 when mounted on the header substrate 18, as described above. Electrical interconnects 13 are formed along the length of the substrate 12 and terminate at contacts 30 on either end of the substrate 12. Also visible are the contacts 34, which again, are intended to be aligned and in contact with the input/output contacts 28 on the header substrate 18.

Figure 7:
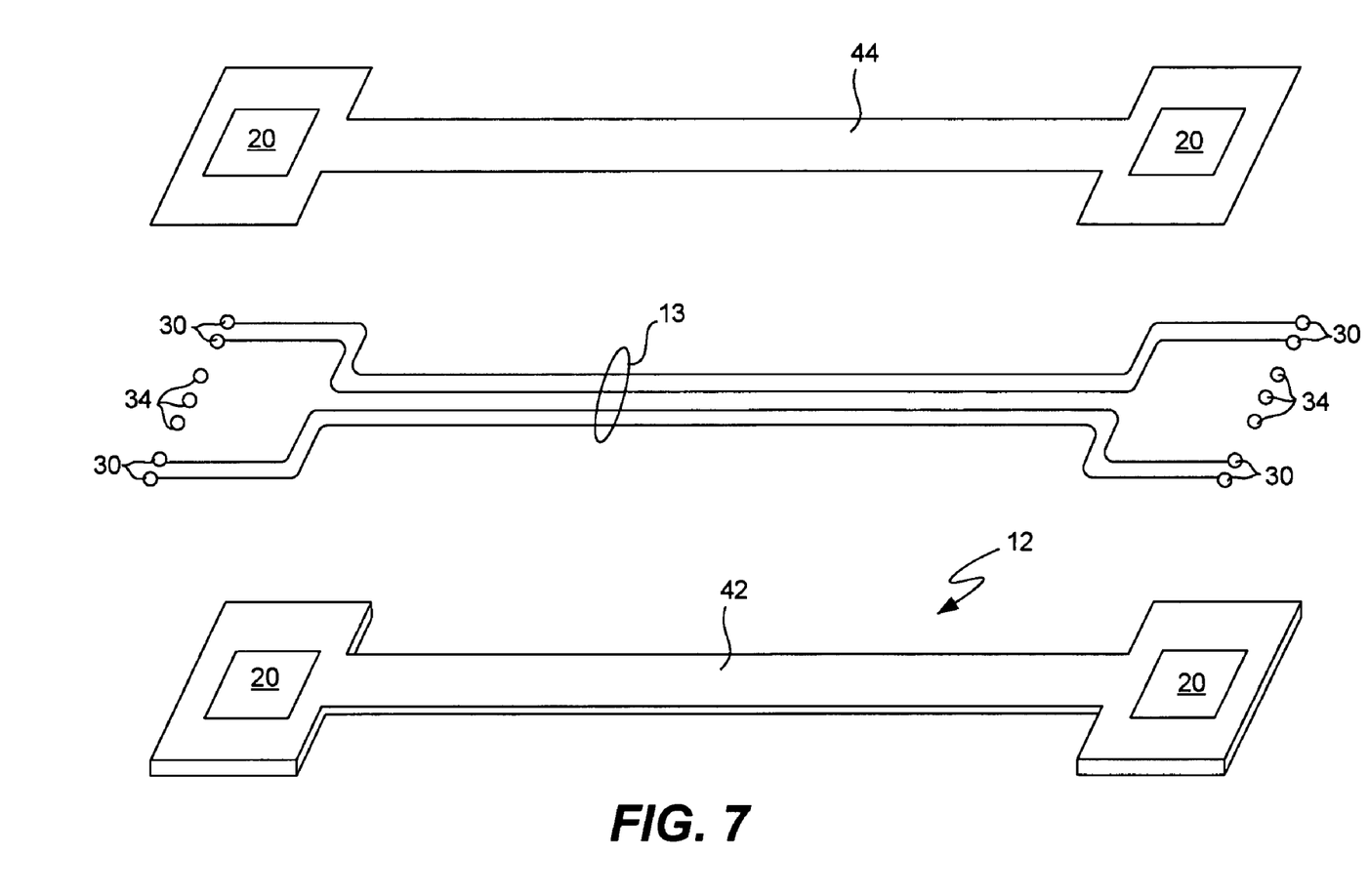
FIG. 7 is an exploded view of the flex printed circuit substrate used by flex assembly according to one embodiment of the present invention.

FIG. 7 is an exploded view of the flex printed circuit substrate 12. As illustrated in the figure, the substrate 12 includes a bottom flexible substrate 42 made from a non-conductive material, such as polyimide, the electrical interconnects 13 and contacts 30, and 34 formed by a metallization pattern on the bottom substrate 42, and a top insulating surface 44 made from, for example, a non-conductive polymer. The layer 44 is patterned so that contacts 30 and 34 are exposed. In some embodiments, the substrate 12 may be configured to be highly flexible (e.g. capable of being placed in the movable hinge of a flip cell phone without being damaged by the opening and closing of the phone.)

In various embodiments, a glue or epoxy may be used to secure the waveguide 14 to the flex substrate 12. Similarly, a glue or epoxy may be used to mount the header substrates 18 to modules 16. In various embodiments, alignment pins or other alignment mechanisms may be used between the flex substrate 12 and the header substrate 18 so that the aforementioned electrical contacts are in alignment with one another respectively.

Figure 8:
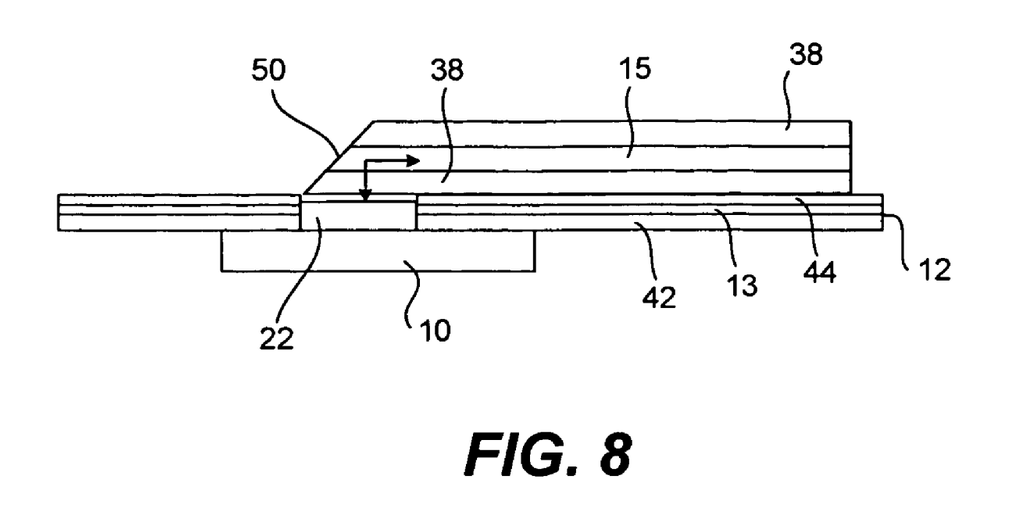
FIG. 8 is a cross section illustrating the optical connection between a core of the optical waveguide and an optical component according to one embodiment of the present invention.

FIG. 8 is a diagram illustrating the optical connection between a core 15 of the waveguide 14 and an optical component 22, for example, according to the present invention. In the embodiment shown, the ends of the core 15 is terminated at a predetermined angle and coated with a reflective or mirrored surface 50. With this arrangement, light traveling down the core 15 reflects off the surface 50 and toward component 22, assuming the component 22 is a photo-detector. Alternatively, if the opto-electric component 22 is a transmitter, light transmitted from the component 22 reflects off the mirrored surface 50 and down the length of the core 15. A similar arrangement would be used with component 24. As noted above in relation to FIG. 3A, the arrangement of the components 22, 24 mounted onto the header substrate 18 and in optical alignment with cores 15 provide an transport layer integrated within the assembly 10. In yet another embodiment, the components 22, 24 can be rotated ninety degrees so that either their photosensitive circuitry or the transmitter provided on these components are in optical alignment with the ends of the cores 15. With such an arrangement, the use of an angled reflective or mirrored surface 50 would not be needed.

Some Exemplary Applications for the Flexible Interconnect Assembly

Figure 9:
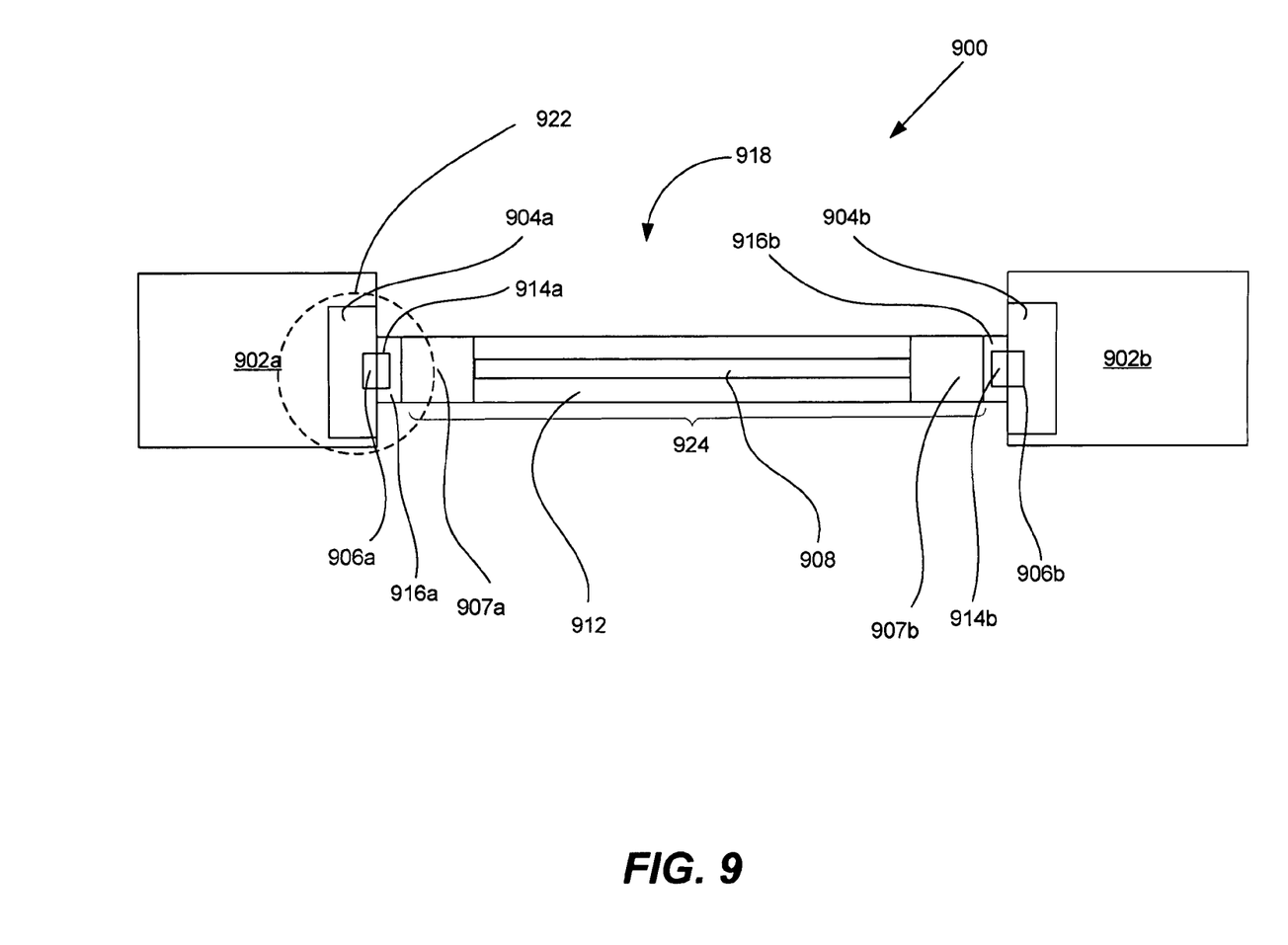
FIG. 9 is a block diagram illustrating two electrical devices coupled together with a flexible interconnect assembly according to one embodiment of the present invention.
Figure 10:
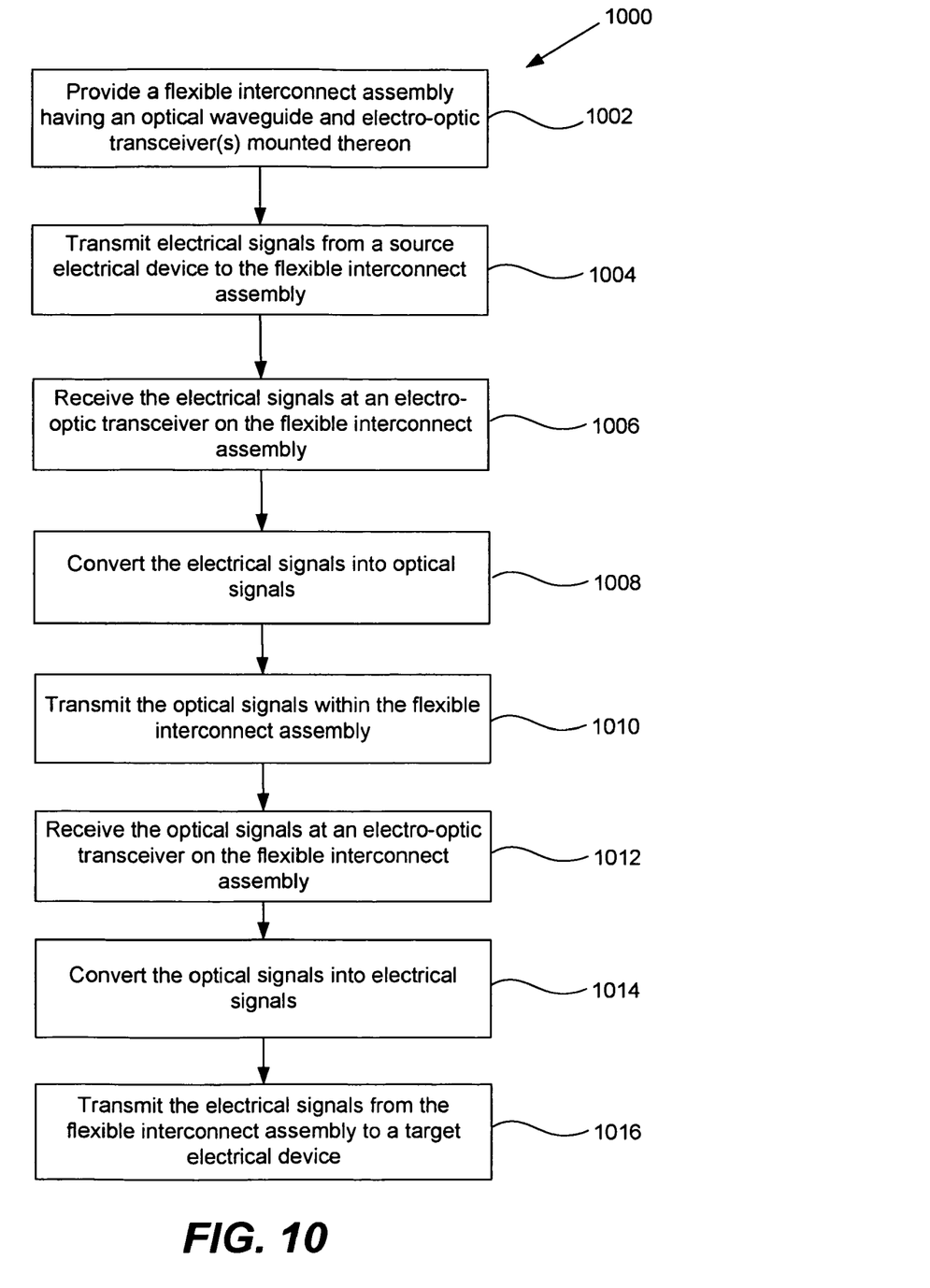
FIG. 10 is a method for transmitting data via a flexible interconnect assembly according to one embodiment of the present invention.

FIGS. 9-10 relate to various exemplary methods, systems and devices for reversibly coupling the flexible interconnect assembly with one or more electrical devices. Particular embodiments involve a flexible interconnect assembly that can be secured to an electrical device, such as a processor, electronic substrate or printed circuit board, using an attachment apparatus mounted onto the electrical device. The attachment apparatus is designed to streamline and simplify the connecting and disconnecting of the flexible interconnect assembly.

Using the flexible interconnect assembly and attachment apparatus in this manner offers several advantages. In comparison to electrical interconnects, optical interconnects are attractive in part because they allow for high speed, high bandwidth data transmission. Configuring electrical devices such as processors and printed circuit boards to convert the received optical signals, however, can be a complicated and costly process. Some embodiments of the present invention help reduce this burden by shifting the conversion infrastructure onto the flexible interconnect assemblies. In these embodiments, electrical devices such as printed circuit boards, multi-core processors and memory can communicate with one another using optical signals without needing to directly convert such signals themselves. The lenses, interfaces and other features required for converting electrical signals into optical ones are instead integrated into the flexible interconnect assemblies, which can be replaced, removed from and attached easily to the electrical devices using the attachment apparatuses. Such replacement, removal and attachment does not require soldering or reflow, thus reducing the costs and complexity of manufacturing and repair.

One particularly important advantage of such interconnect assemblies is their ability to operate in systems having high connection densities. Because the inventive interconnect uses an optical transmission mode it suffers far less from the electromagnetic interference and cross-talk generally associated with high density electrical lines as are commonly used in the art today. Additionally, due to the relative immunity from line to line cross-talk and electromagnetic interference generated by dense processing environments (for example, those using multi-processor cores) the interconnects of the invention can provide high fidelity and uncorrupted signals in high density electronic environments. It is worth pointing out that such advantages make the interconnect embodiments of the present invention particularly suited for the transmission of timing and clock signals. This enables such flexible interconnects to optically transmit critical, time-sensitive data, such as global clock data, with a high degree of fidelity. Such optical signals do not generate electrical interference and so jitter may be reduced, overall system performance may be improved and higher density connection structure may be formed. In some embodiments of the present invention, extremely high waveguide densities may be achieved with optical waveguides having core widths of as little as 8-10 microns with similarly small pitches. In one example, a series of 10 micron cores can have a pitch of 20 microns. It is worth pointing out that the foregoing is merely an illustrative example, with embodiments having core widths of at least 8 microns and pitches of 15-20 micron and greater.

As stated above, some flexible interconnect assemblies can be particularly useful in high-noise environments. Conventional electrical wiring structures commonly suffer from data corruption in such high noise environments. The use of optical signals allows the flexible interconnect assemblies to transmit signals further with less degradation.

One embodiment of the present invention is illustrated in block diagram 900 of FIG. 9. FIG. 9 presents electrical devices 902a and 902b. Each electrical device has an attachment apparatus 904a and 904b with electrical contacts 906a and 906b, respectively. Flexible interconnect assembly 918, which in the illustrated embodiment is a modified version of the opto-electric flex interconnect assembly presented in FIG. 1, couples the two electrical devices together and enables the flow of data between them. In other embodiments, different types of flexible interconnect assemblies may be used.

Assembly 918 and electrical devices 902a and 902b may have a variety of features, depending on the needs of a particular application. Electrical device 902a may be any electrical component requiring, enabling and/or facilitating communication of information with another electrical component. Examples of such an electrical component include any packaged integrated circuit device, such as memory, a central processing unit, a digital signal processor, a graphics controller, a SerDes (serializer-deserializer) or communications device. The electrical component may also be a printed circuit board (PCB) or an electronic substrate configured to be mounted on a PCB in any number of ways (e.g. ball grid array), with conductive traces that lead out to various components on the PCB. (It should be noted that the drawings of FIGS. 9 to 10 are not to scale.) In a particular embodiment, electrical devices 902a and 902b are integrated circuit chips or components mounted on one or more circuit boards. In this iteration, assembly 918 extends between electrical devices 902a and 902b and is not directly mounted on, electrically connected to and/or permanently secured to the aforementioned printed circuit board(s). As a result, assembly 918 may be completely detached from electrical devices 902a and 902b by decoupling only its ends from electrical devices 902a and 902b. In another embodiment, one or more ends of assembly 918 is electrically coupled with a printed circuit board, although other portions of assembly 918 are physically removed from the printed circuit board. This facilitates the removal of flexible interconnect assembly 918 from the board.

Circled region 922 in FIG. 9 illustrates one way in which flexible interconnect assembly 918 may be reversibly secured to electrical device 902a. Mounted on device 902a is an attachment apparatus 904a. One end of assembly 918 is secured to the apparatus 904a through attachment fixture 916a on assembly 918. The coupling of the fixture 916a to apparatus 904a enables their two respective electrical contacts 914a and 906a to come in contact with one another, thus forming an electrical connection. On the other end of assembly 918, attachment fixture 916b (with electrical contact 914b) and attachment apparatus 904b (with electrical contact 906b) are secured to one another in a similar manner.

In the illustrated embodiment, attachment apparatus 904a is similar to attachment apparatus 36 in FIG. 3C. It should be noted, however, that the configuration of attachment apparatus 904a may vary depending on the needs of a particular application. For example, the attachment apparatus may include one or more locks, clamps, slots, depressions, hooks and/or fasteners. Generally, releasing and fastening the flexible interconnect assembly does not requires soldering or high temperature conditions. In many embodiments, a mere physical action e.g. pulling, pushing and/or twisting is all that is needed to release or attach the flexible interconnect assembly.

Attachment fixture 916a on assembly 918 helps facilitate the connection between the assembly 918 and the attachment apparatus 904a. In the illustrated embodiment, attachment fixture 916a is similar to attachment fixture 38 in FIG. 3C, although other types of fixtures may also be used, as discussed earlier. In some iterations, attachment apparatus 904a is designed to accommodate the architecture of flexible interconnect assembly 918 so that the apparatus 904a can be reversibly and electrically coupled with the assembly 918 without the need for fixture 916a. In that case, electrical contact 114a may be positioned elsewhere on flexible interconnect assembly 918. Electrical contact 114a and optional attachment fixture 916a may be positioned in a variety of locations on flexible interconnect assembly 918. For example, a particular embodiment positions one or more electrical contacts on the electro-optic transceiver 907a (described below), which attachment fixture 916a helps secure to the corresponding electrical contact 906a on electrical device 902a.

Region 924 in FIG. 9 includes electro-optic transceivers 907a and 907b, which are positioned near the ends of flexible interconnect assembly 918. The electro-optic transceivers 907a and 907b are coupled with one or more waveguides 908 on flexible substrate 912.

The features of waveguide 908, flexible substrate 912 and transceivers 907a and 907b vary, depending on the needs of a particular application. For example, in some embodiments, substrate 912 is highly flexible and capable of being repeatedly bent and twisted at least 180 degrees e.g. so as to be suitable for placement in the hinge of a cell phone. Particular embodiments include a waveguide 908 that is mounted on substrate 912, which terminates in two ends, both of which are coupled with electrical devices 902a and 902b respectively. That is, waveguide 908 is mounted upon substrate 908, but electrical devices 902a and 902b are not mounted thereupon and may be mounted on one or more physically distinct substrates (e.g. printed circuit board(s)) having less flexibility and/or a different composition from substrate 908.

FIG. 10 shows an exemplary method of transmitting data using region 924 of flexible interconnect assembly 918 of FIG. 9. Initially, in step 1002 of method 1000 of FIG. 10, the flexible interconnect assembly 918 of FIG. 9 is provided with an optical waveguide 108 and electro-optic transceivers 907a and 907b mounted thereon. The electro-optic transceivers convert electrical signals to optical signals and vice versa. In the illustrated embodiment, the assembly 918 has two electro-optic transceivers, but other embodiments may have one or more such transceivers and/or converters that each convert electrical signals to optical signals, optical signals to electrical signals or both.

Electro-optic transceiver 907a, which in the illustrated embodiment is electrically coupled to attachment fixture 916a, receives the set of electrical signals (step 1006). Transceiver 907a, which is mounted on assembly 918, converts the electrical signals into optical signals (step 1008). It should be appreciated that the conversion of electrical signals into optical signals takes place not at an electrical device external to the interconnect assembly 918, but instead takes place entirely within the assembly 918.

In step 1010, the converted optical signals are transmitted along the length of flexible interconnect assembly 918 via one or more waveguides 908. The optical signals are then received at electro-optic transceiver 907b (step 1012). Transceiver 907b converts the optical signals into electrical signals (step 1014.) The resulting electrical signals may be exactly the same as those that were originally transmitted by electrical device 902a, or modulated and/or reformatted in some manner.

After the signals have been reconverted, opto-electric transceiver 907b transmits the electrical signals from the flexible interconnect assembly 918 to electrical device 902b (step 1016). In the illustrated embodiment, the electrical signals travel through optional attachment fixture 916b, which is securely connected with attachment apparatus 904b. Because of the way in which fixture 916b attaches to attachment apparatus 904b, electrical contacts 914b and 906b are in physical contact, allowing the electrical signals to enter electrical device 902b.

By varying the configurations of electrical devices, flexible interconnect assemblies, transceivers and/or signal converters, a wide array of transmission methods and configurations are possible. The illustrated embodiment only presents the unidirectional transmission of signals from electrical device 902a to electrical device 902b, with an electrical-to-optical and a subsequent optical-to-electrical conversion. In other embodiments, electrical device 902b can likewise transmit signals to electrical device 902a, and each of the transceivers 907a and 907b can convert in the reverse direction. Alternative embodiments may involve one or more converters that only convert in one direction and/or assemblies that only transmit in one direction. In some iterations, an assembly may be coupled to one or more devices that can receive and/or transmit optical signals, which alters the types of conversions that the assembly will perform. For example, a particular embodiment involves an interconnect assembly that connects an optical device with an electrical device. The optical device sends optical signals into the assembly, which converts them into electrical signals for use by the electrical device. Some assemblies are coupled to more than two devices. Certain kinds of embodiments involve configurable assemblies, converters and/or transceivers that can be reprogrammed to perform any of the above operations at different times, depending on the needs of a particular application.

Other variations in the functionality and design of the electrical devices and flexible interconnect assembly are also possible. In some embodiments, the flexible interconnect assembly focuses on the transmission and conversion of signals, rather than the processing of converted signals. In these iterations, such processing is left primarily to the electrical devices that are removably secured to the assembly. As a result, in particular embodiments the flexible interconnect assembly may lack a processor, integrated circuit chip and/or electrical device that receives and processes already converted electrical signals. For example, one iteration involves a flexible interconnect assembly that receives electrical signals from an external source, converts them using opto-electric converters into optical signals, and converts the optical signals back into electrical signals that are substantially similar to the ones originally received. In this iteration, converted electrical signals are then transmitted to an external destination and are not substantially altered and/or used to control a process within the flexible interconnect assembly that is unrelated to such transmission.

Although the foregoing invention has been described in some detail for purposes of clarity of understanding, it will be apparent that certain changes and modifications may be practiced within the scope of the appended claims. Therefore, the described embodiments should be taken as illustrative and not restrictive, and the invention should not be limited to the details given herein but should be defined by the following claims and their full scope of equivalents.

I claim:

1. A flexible interconnect assembly for transmitting data, the assembly comprising:
   a flexible substrate;
   at least one optical waveguide suitable for transmitting optical signals, the at least one waveguide mounted onto the flexible substrate;
   an attachment fixture to enable the flexible interconnect assembly to be reversibly coupled to an attachment apparatus; and
   first and second interfaces situated at first and second ends of the flexible interconnect assembly respectively, each interface comprising:
      an interface substrate;
      a header substrate mounted on the interface substrate;
      one or more conversion devices embedded within the interface and positioned on the header substrate, the one or more conversion devices in optical alignment with the optical waveguide and configured to convert between electrical and optical signals and arranged such that all conversion between optical and electrical signals performed at the flexible interconnect assembly takes place only in the interfaces at the ends of the flexible interconnect assembly;
      a plurality of electrically conductive traces, ones of the conductive traces electrically connected with associated ones of the one or more conversion devices; and
      a plurality of exposed electrical contacts that are formed on the exterior of the interface, ones of the exposed electrical contacts being electrically connected with ones of the conversion devices via ones of the electrically conductive traces, the plurality of exposed contacts arranged to be coupled with an electrical device external to the flexible interconnect assembly.

2. The flexible interconnect assembly of claim 1, wherein the at least one optical waveguide has a core pitch of at least 20 microns.

3. The flexible interconnect assembly of claim 1, wherein the at least one waveguide includes at least one core, each one of the at least one core having a diameter ranging between approximately 8 to 10 microns.

4. The flexible interconnect assembly of claim 1, wherein the at least one waveguide includes at least one core configured with a core width of at least 8 microns.

5. A flexible interconnect assembly recited as in claim 1, wherein:
the one or more conversion devices of the first interface enables at least one of: receiving an optical signal from the at least one waveguide and converting it to an electrical signal or receiving an electrical signal from a first electrical input and converting it to an optical signal for transmission through the at least one waveguide; and
the one or more conversion devices of the second interface enable at least one of: receiving an optical signal from the at least one waveguide and converting it to an electrical signal or receiving an electrical signal from a second electrical input and converting it to an optical signal for transmission through the at least one waveguide.

6. A flexible interconnect assembly recited as in claim 5 wherein:
the one or more conversion devices of the first interface are arranged at a first end of the substrate and include a first set of electrical contacts;
the one or more conversion devices of the second interface are arranged at a second end of the substrate and include a second set of electrical contacts; and
wherein the attachment fixture comprises:
a first attachment fixture positioned on the first end of the substrate and configured to enable the flexible substrate to be reversibly coupled and electrically connected with a first attachment apparatus; and
a second attachment fixture positioned on the second end of the substrate and configured to enable the flexible substrate to be reversibly coupled and electrically connected with a second attachment apparatus.

7. A system for transmitting data to a device, comprising:
a first electrical device;
the flexible interconnect assembly of claim 1, the one or more conversion devices of the first interface of the flexible interconnect assembly including
a first conversion device positioned on the flexible circuit substrate, the first conversion device configured to convert between electrical and optical signals; and
an attachment apparatus suitable for reversibly securing a flexible interconnect assembly and electrically coupling the first electrical device and the first conversion device, thereby enabling at least one of: receiving electrical signals from the first conversion device; and transmitting electrical signals to the first conversion device.

8. The system of claim 7, comprising:
a second electrical device coupled with the first electrical device via the flexible interconnect assembly, wherein the first electrical device is a multi-core CPU and the second electrical device is memory.

9. The system of claim 7,
wherein a second conversion device of the one or more conversion devices of the second interface of the flexible interconnect assembly is configured to convert a first set of electrical signals into a set of optical signals;
wherein the first conversion device is configured to receive the set of optical signals from the second conversion device and convert the set of optical signals into a second set of electrical signals for transmission to the first electrical device; and
wherein the attachment apparatus is configured to receive the second set of electrical signals from the first conversion device and transmit the second set of electrical signals to the first electrical device.

10. The system of claim 9, wherein:
the optical waveguide extends between the first and second ends of the flexible interconnect assembly and is configured to transmit the set of optical signals along the length of the flexible interconnect assembly between the first and second conversion devices.

11. The system of claim 7, wherein the attachment apparatus comprises a first set of electrical contacts and wherein the flexible interconnect assembly comprises a second set of electrical contacts and wherein the attachment apparatus is configured such that the coupling of the attachment apparatus and the flexible interconnect assembly causes the first set of electrical contacts to electrically connect with the second set of electrical contacts, thereby enabling transmission of electrical signals between the first electrical device and the flexible interconnect assembly.

12. The system of claim 11, wherein the first electrical device is an electronic substrate mounted onto a printed circuit board, the electronic substrate having conductive traces that electrically connect the first set of electrical contacts of the attachment apparatus with a plurality of electrical components on the printed circuit board, the flexible interconnect assembly configured to transmit electrical signals to at least one of the plurality of electrical components via the second set of electrical contacts, the first set of electrical contacts and the conductive traces.

13. The system of claim 7, wherein the attachment device is configured to be fastened to the flexible interconnect assembly without the use of soldering.

14. A method for transmitting data to an electrical device, comprising:
providing the flexible interconnect assembly of claim 1, wherein the flexible interconnect assembly is coupled to a first electrical device;
transmitting a first set of electrical signals from the first electrical device to the flexible interconnect assembly;
receiving the first set of electrical signals at a first one of at least one electro-optic transceiver mounted onto the flexible interconnect assembly; and
converting, using the first one of the at least one electro-optic transceiver, the first set of electrical signals into a set of optical signals.

15. The method of claim 14 comprising:
transmitting, using the optical waveguide, the set of optical signals to a second one of the at least one electro-optic transceiver mounted onto the flexible interconnect assembly;
receiving the set of optical signals at the second one of the at least one electro-optic transceiver device;
converting, using the second one of the at least one electro-optic transceiver, the set of optical signals into a second set of electrical signals; and
transmitting the second set of electrical signals to a second electrical device coupled to the flexible interconnect assembly.

16. The method of claim 14 comprising:
   transmitting, using the optical waveguide, the set of optical signals;
   converting, using the at least one electro-optic transceiver, the set of optical signals into a second set of electrical signals; and
   transmitting the second set of electrical signals to a second electrical device coupled to the flexible interconnect assembly.

17. The method of claim 14, wherein the first set of electrical signals and the set of optical signals relate to clock synchronization data.

18. The method of claim 14 comprising:
   coupling the flexible interconnect assembly to the first electrical device via an attachment apparatus, wherein said coupling establishes an electrical connection between the first electrical device and said at least one transceiver, the attachment apparatus being configured to couple to or decouple from the flexible interconnect assembly without soldering.

19. A method for transmitting data to an electrical device, comprising:
   providing the flexible interconnect assembly of claim 1, the flexible interconnect assembly having at least one electro-optic transceiver optically coupled with the optical waveguide;
   receiving a set of optical signals at the optical waveguide;
   converting, using a first one of the at least one electro-optic transceiver, the set of optical signals into a set of electrical signals; and
   transmitting the set of electrical signals to an electrical device.

20. A system for communicating signals between multiple electrical components, comprising:
   a plurality of electrical components;
   a plurality of flexible interconnect assemblies coupling the plurality of electrical components to one another using an associated plurality of coupling systems, each flexible interconnect assembly being a flexible interconnect assembly as recited in claim 1 and configured to:
      receive a first set of electrical signals from a first one of the electrical components;
      convert the first set of electrical signals into a set of transformed signals;
      transmit the set of transformed signals along the length of the flexible interconnect assembly;
      convert the set of transformed signals into a second set of electrical signals; and
      transmit the second set of electrical signals to a second one of the electrical components, wherein the plurality of flexible interconnect assemblies are configured such that there is no crosstalk between the plurality of flexible interconnect assemblies while the plurality of flexible interconnect assemblies are transmitting signals.

21. The system of claim 20, wherein the plurality of electrical components includes a multi-core CPU and memory.

22. The system of claim 20, wherein each one of the plurality of flexible interconnect assemblies has at least one optical waveguide, the at least one optical waveguide having a core pitch of approximately 20 microns.

23. The system of claim 20, wherein each of the plurality of electrical components lacks the ability to directly process optical signals.

24. The system of claim 20, wherein the first set of electrical signals, the set of transformed signals and the second set of electrical signals are related to clock signals.

25. A system for communicating optical signals between a plurality of electrical devices via a flexible interconnect assembly, the system comprising:
   the flexible interconnect assembly of claim 1, the attachment fixture of the flexible interconnect assembly mounted on the first interface at the first end of the flexible interconnect assembly; and
   an electrical device, an attachment apparatus mounted on an exterior surface of the electrical device, the attachment fixture at the first end of the flexible interconnect assembly being at least partially inserted into an opening in the attachment apparatus on the electrical device, the attachment fixture being secured to the attachment apparatus on the electrical device with a locking mechanism in the opening of the attachment apparatus, the locking mechanism involving at least one of a group selected from: a clamp, a fastener, a latch, a lever, a hook and a ring, the locking mechanism arranged to help establish an electrical connection between the flexible interconnect assembly and the electrical device, wherein the locking mechanism in the opening is arranged such that the attachment apparatus on the electrical device is entirely decoupled from the attachment fixture on the flexible interconnect assembly upon application of pressure and without application of heat.

* * * * *